Sept. 27, 1966
W. L. DEEG
SEQUENTIAL COUNTING CIRCUIT USING
DIFFERENTIALLY OPERATED RELAYS
Filed April 21, 1964
3,275,896
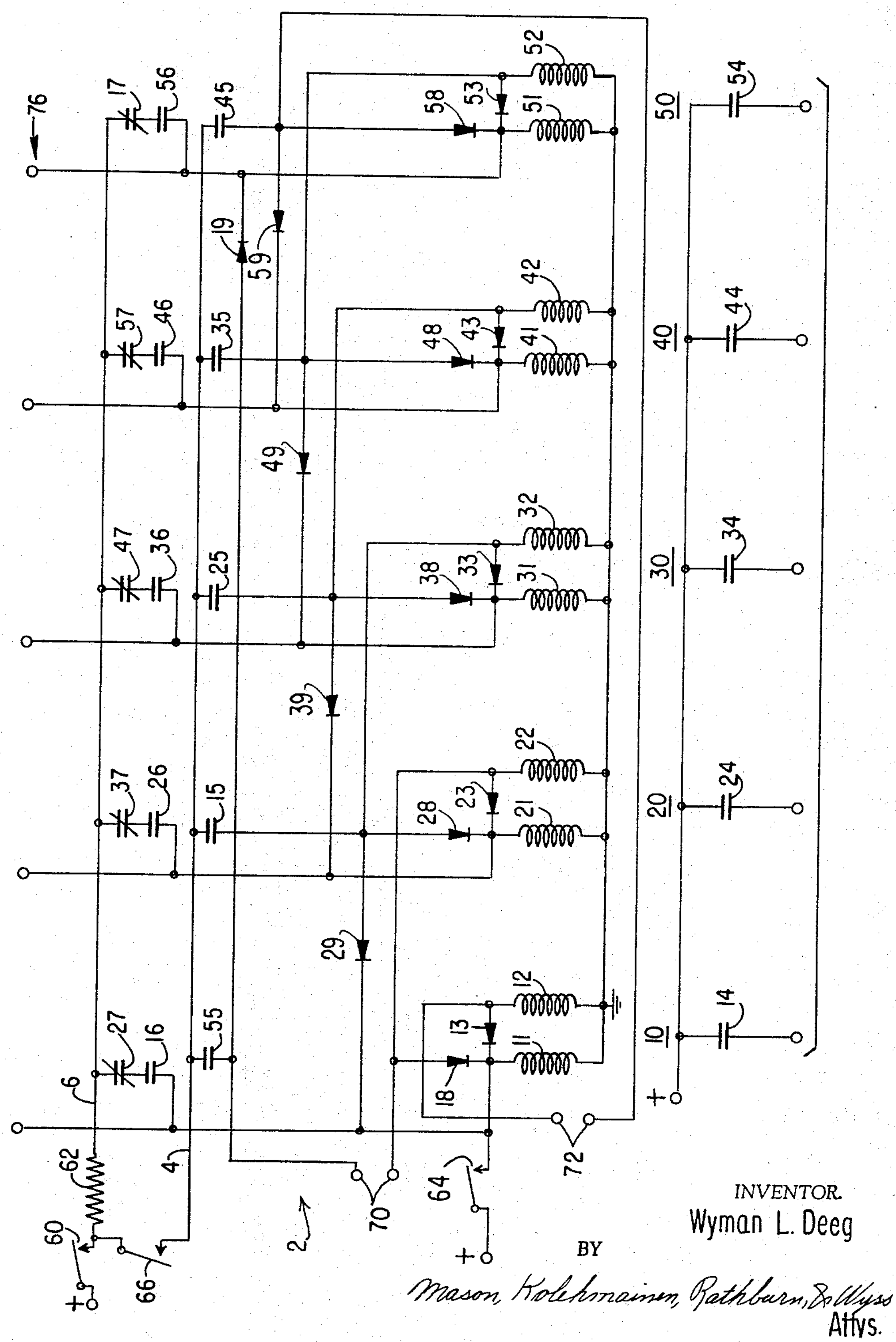
INVENTOR.
Wyman L. Deeg
BY
Mason, Kolehmainen, Rathburn, & Wyss
Attys.

United States Patent Office 3,275,896
Patented Sept. 27, 1966

3,275,896
SEQUENTIAL COUNTING CIRCUIT USING DIFFERENTIALLY OPERATED RELAYS

Wyman L. Deeg, Glenview, Ill., assignor to C. P. Clare & Company, Chicago, Ill., a corporation of Delaware Filed Apr. 21, 1964, Ser. No. 361,598
9 Claims. (Cl. 317—140)

This invention relates to a counting circuit and, more particularly, to a counting circuit using sealed magnetic switches.

The copending application of Wyman L. Deeg, Serial No. 210,119, filed July 16, 1962, discloses a number of counting circuits and registers in which the different counting or register stages are provided by control modules. Each of the modules shown in this copending application includes two separate groups of sealed magnetic switches having individual differential operating windings that permit the two groups of switches to be sequentially operated. In some applications in which the improved characteristics of the module or sealed switch counting stage are desired, the cost of the counting circuits is too high. Thus, it would be desirable to provide a counting circuit using sealed switch modules which possess the advantages thereof, but which require a smaller number of components and can be not only manufactured at a lower cost but will require less installation space.

Accordingly, one object of the present invention is to provide a new and improved counting circuit.

Another object is to provide a new and improved counting circuit including magnetic sealed switch units.

A further object is to provide a counting circuit of the type using sealed magnetic switch units in which the number of switch units and operating windings required is substantially reduced.

A further object is to provide a counting circuit in which an input signal concurrently operates the desired counting stage and inhibits the operation of another stage.

In accordance with these and many other objects, an embodiment of the present invention comprises a counting circuit including a desired number of counting stages each formed by a sealed magnetic switch control or counting module. Each of the modules includes a pair of windings providing oppositely poled flux fields of equal value, which windings are coupled together by a unidirectional conducting device or diode means. A group of sealed magnetic switches each operable by the application of a magnetic flux field of the given value is associated with each of the pairs of windings.

The plurality of counting modules are connected in a counting circuit for sequential operation. This interconnection is such that one of the sealed switches in the module for a given stage connects the set or operate terminal of the module forming the next highest stage to a common input signal conductor whereby the operation of the given stage of the counter prepares an operating circuit for the adjacent counting stage. In order to prevent sequential operation of a plurality of stages during a single input signal, each input signal is directed not only to the set or operate input of the module in the stage to be operated, but also to the reset terminal of the higher adjacent stage. A signal applied to the reset terminal of a module causes the concurrent energization of both of the windings so that the oppositely poled flux fields of equal strength are incapable of operating the magnetic elements of the sealed switches. In this manner, each input signal supplied to a stage to be operated performs the additional function of inhibiting the operation of stages that are not to be operated. The remaining sealed switches in each module are used to provide isolated outputs and holding or latching circuits for the stages. The counting circuit is useful in and can be designed to provide either a serial counting sequence or a closed or reentrant counting sequence.

Many other objects and advantages of the present invention will become apparent from considering the following detailed description in conjunction with the drawing which forms a schematic diagram of a counting circuit embodying the present invention.

Referring now more specifically to the drawing, therein is illustrated a counting circuit indicated generally as 2 which embodies the present invention and which comprises five counting stages indicated generally as 10, 20, 30, 40, and 50, each formed by a sealed magnetic switch control module. The counting circuit 2 interconnects the improved control modules forming the stages 10, 20, 30, 40, and 50 in a manner utilizing diode and magnetic flux logic to provide an exclusive "Or" counter requiring a reduced number of components and affording the advantages of sealed magnetic switch modular construction, such as increased load switching capabilities and improved output isolation. The circuit 2 is also so designed that the magnetic switches therein switch voltages no higher than the forward voltage of a diode, i.e., a potential value in the range of one volt or less, and thus, further extends the operating life of the sealed switch.

The control modules forming the counter stages 10, 20, 30, 40, and 50 can be of the physical construction described and disclosed in detail in the above-identified copending application. The module forming the counting stage 10, which is identical to the modules forming the counting stages 20, 30, 40, and 50, includes a pair of operating windings or coils 11 and 12 providing oppositely poled flux fields of equal value. One terminal of each of the coils 11 and 12 is connected to a source of reference potential, such as ground, and the other terminals of the windings or coils are coupled by a diode 13. Each of the modules also includes four sealed magnetic switches 14–17 which are operated by the application of a flux field of the unit or given value developed by either of the windings 11 or 12. The sealed switch 17 provides a pair of normally closed contacts, and the switches 14–16 provide normally open contacts.

When a flux field of a unit value is applied to the switches 14–17, as by the application of a properly poled potential to the set terminal afforded by the anode of the diode 13, the winding 11 is energized to open the contacts 17 and to close the contacts 14–16. These switches can be restored to their normal positions by terminating the energization of the winding 11. Further, these switches can be released or their initial operation prevented by applying an energizing potential to a reset or inhibit terminal afforded by the cathode of the diode 13. The application of a positive potential to this terminal causes the concurrent energization of both of the windings 11 and 12 to produce oppositely poled flux fields of equal value. These flux fields are combined in the magnetic elements of the switches 14–17 to result in a net or effective field of little or no value. Thus, the switches 14–17 cannot be operated, or alternatively, can be released by the application of a suitably poled energizing potential to the reset or inhibit terminal afforded by the cathode of the coupling diode 13.

The contacts 15 prepare a path between a common input conductor 4 and the set terminal of the adjacent or next higher stage 20, and the contacts 16 complete a holding circuit for the stage 10 extending to its set terminal from a common holding or latch conductor 6. The contacts 17 interrupt the holding circuit to the set terminal of the next lower stage. The contacts 14 provide isolated output means interposed between a source of output potential and a terminal that can be connected to a suitable output means, such as recording or visual display means, for indicating the setting of the counting circuit 2 or the value stored therein.

The modules comprising the remaining counting stages 20, 30, 40, and 50 are identical to the module forming the counting stages 10 and include two differential operating windings, a coupling diode, and four sealed magnetic switch units corresponding to those elements in the module forming the counting stage 10. These corresponding elements are identified in the drawings by reference numbers having identical units digits and tens digits that correspond to the tens digit of the related counter stage, i.e., the two operating windings in the counter stage 30 are designated 31 and 32 and correspond to the operating windings 11 and 12 in the counter stage 10.

The modules forming the counting stages 10, 20, 30, 40, and 50 are connected for sequential operation so that following the receipt of each input signal, the sealed switches in only a single one of the stages will be in an operated condition. In general, the circuit network interconnecting the various stages of the counter 2 is such that the operation of a given stage completes a path over a contact controlled by this stage from the common input signal conductor 4 to the set terminal of the next higher stage in the counting sequence. Operation of this next higher stage by the input signal is inhibited by circuit means concurrently supplying the input signal to the reset terminal of this next higher stage. Further, the circuit means is such that the operation of any given counter stage completes a holding circuit from the holding or latching conductor 6 to the set terminal of the given stage, and this holding circuit remains completed until the operation of the next higher stage in the counting sequence.

When the counting circuit 2 is to be operated, it is reset to a normal condition by actuating a reset switch 60 to an open condition so that the positive holding potential normally supplied to the conductor 6 through a series resistor 62 is removed. This opens any completed holding circuits in the circuit 2 and releases any operated one of the counting stages 10, 20, 30, 40, or 50. The switch 60 is then reclosed to condition the circuit 2 for operation. To prime the circuit 2 to a zero or normal setting, a normally open zero set switch 64 is closed to apply a positive potential to the set terminal of the first counting stage 10. The positive potential provided by the closed switch 64 energizes the winding 11 so that a flux field of the given value is applied to the magnetic elements in the four related switches 14–17 to close the switches 14–16 and to open the switch 17.

The opening of the switch 17 performs no useful function in view of the prior resetting of the counter 2. However, the closure of the contacts 16 completes a holding circuit for the winding 11 extending through a pair of normally closed contacts 27 to the holding conductor 6. Thus, when the switch 64 is opened, the first counting stage 10 remains in an operated condition. The closure of the contacts 14 energizes the output terminal corresponding to the first counting stage 10. The closure of the contacts 15 connects the common input signal conductor 4 to the set terminal of the second counting stage 20 through a diode 28.

When the counter 2 is to be advanced a single step, a positive-going input signal is applied to the common input conductor 4 by closing a switch 66. The positive potential provided by the closed switch 66 is forwarded through the closed contacts 15 and a forward biased diode 29 to the set terminal of the first counting stage 10 to maintain the energization of the winding 11 during the first input pulse provided by the momentarily closed switch 66. This prevents the release of the first counter stage 10 during the interval in which the first input pulse is applied to the counting circuit 2. The positive potential supplied through the closed contacts 15 is also forwarded to the reset terminal of the third counting stage 30 so that the winding 32 is directly energized and so that the winding 31 is energized through the diode 33. Since both of the windings 31 and 32 in the third counting stage 30 are energized, the operation of the third counting stage 30 is inhibited. The positive potential of the first input pulse is also forwarded through the contacts 15 and a diode 28 to energize the winding 21 in the second counting stage. This actuates the counting stage 20 by opening the contacts 27 and closing a plurality of contacts 24–26. Thus, the first input pulse operates the second counting stage 20, provides a momentary holding potential for the operated first counting stage 10, and inhibits the operation of the third counting stage 30.

The closure of the contacts 26 completes a holding circuit for the winding 21 of the second counting stage 20 extending through a pair of normally closed contacts 37 in the third counting stage 30. The closure of the contacts 24 provides an output indication to the readout facilities indicating that the second stage 20 of the counter 2 has been operated. The closure of the contacts 25 connects the input conductor 4 through a diode 38 to the winding 31 of the third counting stage 30. Since the windings 31 and 32 are both energized by the potential supplied to the reset terminal of the third counting stage 30, the closure of the contacts 25 does not cause the operation of the switches 34–37 in the third counting stage 30. The opening of the contacts 27 interrupts the holding circuit for the winding 11 of the first counting stage 10. However, this winding remains energized by the holding potential supplied from the conductor 4 through the closed contacts 15 and the diode 29.

When the switch 66 is opened to terminate the first input pulse applied to the input conductor 4, the holding potential supplied through the diode 29 is removed, and the energization of the winding 11 is terminated so that the first counting stage 10 is restored to its normal condition and opens the contacts 14–16 and closes the contacts 17. The closure of the contacts 17 prepares the holding circuit for the fifth counting stage 50. The opening of the contacts 15 interrupts the above-described operating circuit for the second counting stage 20. The opening of the contacts 14 disconnects the output indication corresponding to the first counting stage 10, and the opening of the contacts 16 interrupts the holding circuit for the first counting stage 10 at an additional point. The removal of the positive potential from the conductor 4 at the end of the first input pulse also removes the energization applied to the reset terminal of the third counting stage 30 so that the windings 31 and 32 are no longer energized.

When the second input pulse is applied to the conductor 4 by closing the switch 66, it is forwarded through the closed contacts 25 to supply a holding potential through the diode 39 to the operated counter stage 20. It is also forwarded to the reset terminal of the fourth counting stage 40 to energize both of the windings 41 and 42 so that the operation of the fourth counting stage 40 is inhibited. This pulse is also forwarded through the diode 38 to energize the winding 31 in the third counting stage 30 to cause the actuation of the four switches 34–37 in the third counting stage. The termination of the third counting pulse releases the second counting stage 20, removes the inhibiting potential from the fourth counting stage 40, and permits the third counting stage 30 to remain in an operated condition under the control of its holding circuit including the closed contacts 36 and 47. In this manner, the remaining stages 40 and 50 of the counter 2 can be operated. Obviously, additional stages similar to those illustrated can be provided in accordance with the desired counting capacity of the counter 2. As set forth above, the counter is restored to a normal condition by opening the reset switch 60 to remove the holding potential from the conductor 6.

The counting circuit 2 can also be modified to provide a counting ring in which the operation of the last stage of the counter, shown as the counting stage 50, serves to direct the next input pulse applied to the conductor 4 to the first stage of the counter, shown as the counting stage 10. More specifically, when the counter 2 is to be adapted for operation as a ring counter, jumpers are connected between two pairs of terminals 70 and 72. The jumpered terminals 72 connect the reset terminal of the first counting stage 10 to the path including the steering contacts 45 in the input to the fifth counting stage 50. Thus, when the last or fifth counting stage 50 is being operated, an inhibiting potential is applied to the first counting stage 10 to prevent its operation. The jumpered terminals 70 connect an input diode 18 for the first counting stage 10 to a signal input circuit including a pair of normally open contacts 55 in the last counting stage 50. Thus, when the fifth or last counting stage 50 is operated and the contacts 55 have been closed, the next input pulse applied to the conductor 4 is forwarded through the closed contacts 55 and a diode 19 to hold the fifth stage 50 operated during the input pulse. This pulse is also forwarded through the jumpered terminals 70 to the reset terminal of the counting stage 20 to inhibit its operation. This pulse is also forwarded through the diode 18 to operate the first counting stage 10. When operated, the stage 10 performs the same functions described above. However, the opening of the contacts 17 now performs the function of interrupting the latching or holding circuit for the fifth counting stage 50 so that it is restored to normal as soon as the input pulse disappears from the conductor 4.

As described above, the circuit 2 includes the switches or contacts 14, 24, 34, 44, and 54 for providing an output. Additional isolated outputs can be provided by adding sealed switch units to each of the counting or control modules forming the counting stages 10, 20, 30, 40, and 50. However, in certain applications in which the counting circuit 2 is to be carried on standard sizes of printed circuit boards, there is a limit to the number of sealed switches that can be added to the modules. Accordingly, the circuit includes additional means for deriving non-isolated outputs that are useful for a number of purposes.

As an example, the counter 2 includes a plurality of output terminals indicated collectively as 76 which provide a bridged output derived from the system potential source. Each of these terminals is energized at the beginning of the input pulse operating the related counter stage and remains energized until the end of the next input signal that operates the next higher stage. This type of bridged output can, for example, be used with lamp or other visible display indicators in which the overlapped energization provided by the bridged output signal is not a source of error. In addition, a non-bridged voltage output can be derived from connections to the individual or output sides of the contacts 15, 25, 35, 45, and 55. This non-bridged output, which persists only during the length of each input pulse, is suitable for use with such equipment as printers and recorders in which a bridged output might cause an erroneous indication.

The resetting switch 60, the priming switch 64, and the input pulse generating switch 66 are shown as comprising manually actuated switches to simplify the illustration of the invention. However, it should be understood that some or all of these switching means can comprise transistors or similar controlled conduction devices, or can comprise electromagnetically operated relays. The arrangement of the circuit 2 is also such that only the components 60, 64, and 66 ever switch a potential larger than the forward drop across one of the diodes in the circuit.

Although the present invention has been described with reference to a single illustrative embodiment thereof, it should be understood that numerous other modifications and embodiments can be devised by those skilled in the art that will fall within the spirit and scope of the principles of this invention.

What is claimed and desired to be secured by Letters Patent of the United States is:

1. A counting circuit operated by a series of input signals comprising a plurality of counting stages arranged in a counting sequence, each of the stages including a pair of windings providing oppositely poled flux fields of substantially the same value and switching means operated by the application of the flux field resulting from the energization of one winding, a source of input signals, circuit means connected between the signal source and the stages for applying successive input signals to the windings in consecutive pairs of adjacent stages in the counting sequence, said circuit means including the switching means in the adjacent stage lower in the counting sequence for applying an input signal to one winding in one stage in the pair to operate its associated switching means and applying an input signal to both of the windings in the other stage of the pair to inhibit operation of the switching means in this other stage, said circuit means also including a holding circuit for each of the stages including an energizing circuit connected to one of the windings in each stage through the switching means in the next highest stage in the counting sequence, and start circuit means connected to one winding in one of the stages to operate this one stage to prepare the counting circuit for operation.

2. The counting circuit set forth in claim 1 in which the circuit means includes an additional circuit connected between the input switching means for one stage and one winding in the next lowest stage in the counting sequence for connecting the signal source to the one winding in the next lowest stage.

3. A counting circuit operated by a source of input signals comprising a plurality of counting stages, each of the stages including both a pair of windings providing oppositely poled flux fields of substantially the same value and a sealed switch including magnetic elements operable in response to an applied flux field from one of the windings; a network connecting the plurality of counting stages for sequential operation, said network including circuit means for directing successive input signals to energize one of the windings in the stage to be operated and for applying successive input signals to energize both of the windings in the stage adjacent the stage to be operated to prevent the operation of the adjacent stage, said circuit means including the sealed switch in the stage next lowest in the counting sequence to the stage to be operated; and a holding circuit for each stage and connected to one winding in each stage to hold each stage operated until the next highest stage in the counting sequence is operated.

4. A counting circuit operable by a series of input signals comprising a plurality of counting stages, each of the counting stages including a pair of windings providing oppositely poled flux fields of substantially the same value, said stages also including at least a pair of sealed switches, each switch being operable by an applied flux field from one of the associated windings; and a network connecting the counting stages for sequential operation in response to the series of input signals, said network including a single input signal conductor individually connected in sequence to each of the stages, said conductor being coupled to one winding in a given stage over a path including the sealed switch in the next lowest stage in the counting sequence, said path also coupling the conductor to one of the windings in said next lowest stage and both of the windings in the stage that is next highest to the given stage in the counting sequence.

5. A counting circuit operable by a series of input signals comprising a plurality of counting stages, each of the counting stages including a pair of windings providing oppositely poled flux fields of substantially the same value, said stages also including at least a pair of sealed switches, each switch being operable by an applied flux field from one of the associated windings; and a network connecting the counting stages for sequential operation in response to the series of input signals, said network including a single input signal conductor common to all of the stages, circuit means in the network including one of the sealed switches in each given stage for connecting one of the windings in the next highest stage in the counting sequence to the common input signal conductor to permit the next highest stage to be operated by the following input signal, said circuit means also being connected to both of the windings in the stage that is next above the said next highest stage in the counting sequence to energize both of the windings in this stage to prevent concurrent operation of the adjacent stage and the next adjacent stage.

6. A counting circuit operable by a series of input signals comprising a plurality of counting stages, each of the counting stages including a pair of windings providing oppositely poled flux fields of substantially the same value, said stages also including at least a pair of sealed switches, each switch being operable by an applied flux field from one of the associated windings; and a network connecting the counting stages for sequential operation in response to the series of input signals, said network including a single input signal conductor common to all of the stages which is sequentially connected to one of the windings in each of the stages, said network including a first circuit means for connecting the conductor to one winding in a given stage over a path through a sealed switch in the stage next lowest to the given stage in the counting sequence to operate the given stage, said first circuit means also coupling the conductor to both windings in the stage that is next highest to the given stage in the counting sequence, said network also including second circuit means operated when a given stage is operated for coupling the conductor over a path including a sealed switch in said given stage to both of the windings in the stage that is spaced two stages from the given stage in the direction of counting.

7. A counting circuit operated by a series of input signals comprising a plurality of counting stages arranged in a counting sequence, each of the stages including a pair of windings providing oppositely poled flux fields of substantially the same value and sealed switching means operated by the application of a flux field from one of the associated windings, a source of input signals, and circuit means connected between the signal source and the stages for applying successive input signals to the windings in three consecutive stages in the counting sequence, said circuit means including the operated switching means in a given first one of the stages for applying an input signal to energize a single winding in the given first stage to hold the first stage operated and to energize a single winding in a second stage that is next highest to the given first stage in the counting sequence to operate this second stage, said circuit means also including a path through the switching means in said first stage for applying the input signal to both of the windings in a third stage that is next highest in the counting sequence to said second stage to prevent operation thereof during the persistence of the input signal.

8. A counting circuit for use with a series of input signals comprising a plurality of counting stages adapted to be operated in a counting sequence, each of the counting stages including a pair of windings providing oppositely poled flux fields of substantially the same value, each of the pairs of windings having first and second terminals coupled by a unidirectional conduction device so that a signal applied to the first terminal energizes one of the windings in the pair and a signal applied to the second terminal energizes both of the windings in the pair, first and second switch means in each of the counting stages, each of said switch means being operated by an applied flux field from one of the associated windings, output means including the first switch means in each of the stages for providing an indication of the setting of the counting circuit, and circuit means for applying the input signals to the various stages in the counting sequence, said circuit means including the second switch means in a given one of the stages for applying an input signal to the first terminal in a first stage that is next highest to the given stage in the counting sequence and to the second terminal in a second stage that is next highest in the counting sequence to the first stage.

9. The counting circuit set forth in claim 8 in which each of the stages includes both a normally open third switch means and a normally closed fourth switch means, a source of holding potential, and additional circuit means including the third switch means in each stage for connecting the first terminal in the same stage to the source of holding potential over a circuit including the fourth switch means in the stage that is next highest in the counting sequence.

References Cited by the Examiner

UNITED STATES PATENTS

| | | | |
|---|---|---|---|
| 2,616,958 | 11/1952 | Westerveld | 317—140 X |
| 2,926,289 | 2/1960 | Taugner | 317—155.5 |
| 3,042,900 | 7/1962 | Werts | 317—140 X |
| 3,160,794 | 12/1964 | Gill | 317—155.5 X |

STEPHEN W. CAPELLI, *Primary Examiner.*

SAMUEL BERNSTEIN, *Examiner.*

J. A. SILVERMAN, *Assistant Examiner.*